(12) United States Patent
Libous et al.

(10) Patent No.: US 6,806,563 B2
(45) Date of Patent: Oct. 19, 2004

(54) COMPOSITE CAPACITOR AND STIFFENER FOR CHIP CARRIER

(75) Inventors: James Patrick Libous, Endwell, NY (US); Joseph Maryan Milewski, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/392,615

(22) Filed: Mar. 20, 2003

(65) Prior Publication Data

US 2004/0183184 A1 Sep. 23, 2004

(51) Int. Cl.[7] .......................... H01L 23/52; H01L 23/053
(52) U.S. Cl. ...................... 257/691; 257/700; 257/701; 257/708

(56) References Cited

U.S. PATENT DOCUMENTS

| | | | | |
|---|---|---|---|---|
| 3,617,817 A | * | 11/1971 | Kawakatsu et al. | 257/691 |
| 4,222,090 A | | 9/1980 | Jaffe | 361/386 |
| 4,349,862 A | * | 9/1982 | Bajorek et al. | 361/762 |
| 5,382,827 A | * | 1/1995 | Wang et al. | 257/528 |
| 5,422,513 A | * | 6/1995 | Marcinkiewicz et al. | 257/668 |
| 5,635,767 A | | 6/1997 | Wenzel et al. | 257/778 |
| 5,659,455 A | | 8/1997 | Herbert | 261/306.1 |
| 5,741,729 A | * | 4/1998 | Selna | 438/125 |
| 5,748,451 A | | 5/1998 | Thompson et al. | 361/788 |
| 5,796,165 A | * | 8/1998 | Yoshikawa et al. | 257/728 |
| 5,973,928 A | * | 10/1999 | Blasi et al. | 361/760 |
| 6,012,336 A | | 1/2000 | Eaton et al. | 73/754 |
| 6,043,559 A | * | 3/2000 | Banerjee et al. | 257/700 |
| 6,081,426 A | * | 6/2000 | Takeda et al. | 361/704 |
| 6,127,250 A | | 10/2000 | Sylvester et al. | 438/584 |
| 6,534,723 B1 | * | 3/2003 | Asai et al. | 174/255 |
| 6,535,398 B1 | * | 3/2003 | Moresco | 361/792 |
| 6,545,353 B2 | * | 4/2003 | Mashino | 257/724 |
| 6,570,250 B1 | * | 5/2003 | Pommer | 257/731 |
| 2001/0013425 A1 | * | 8/2001 | Rokugawa et al. | 174/262 |
| 2001/0023533 A1 | | 9/2001 | Sylvester | 29/830 |
| 2002/0074621 A1 | | 6/2002 | Cheng | 257/532 |
| 2002/0195700 A1 | * | 12/2002 | Li | 257/700 |
| 2003/0178726 A1 | * | 9/2003 | Ogawa et al. | 257/758 |

FOREIGN PATENT DOCUMENTS

JP     2000232260 A     8/2000     ............ H05K/1/02

\* cited by examiner

*Primary Examiner*—Jasmine Clark
(74) *Attorney, Agent, or Firm*—Arthur J. Samodovitz

(57) ABSTRACT

A chip package comprises a substrate with a composite capacitor/stiffener on the substrate. In one embodiment of the present invention, the substrate comprises a plurality of dielectric layers and a plurality of metallic layers interlaced with the dielectric layers. One of the metallic layers is on a surface of the substrate. Another dielectric layer is adhered onto the one metallic layer. A metallic plate is adhered onto the other dielectric layer, opposite the one metallic layer. The metallic plate is electrically connected to power or ground. The one metallic layer is electrically connected to ground or power, respectively, such that the metallic plate, the other dielectric layer and the one metallic layer form a capacitor. The one metallic layer is joined to a respective one of the plurality of dielectric layers in a same manner as another of the plurality of metallic layers is joined to another, respective one of the plurality of dielectric layers. Other embodiments of the composite capacitor/stiffener are also disclosed.

23 Claims, 4 Drawing Sheets

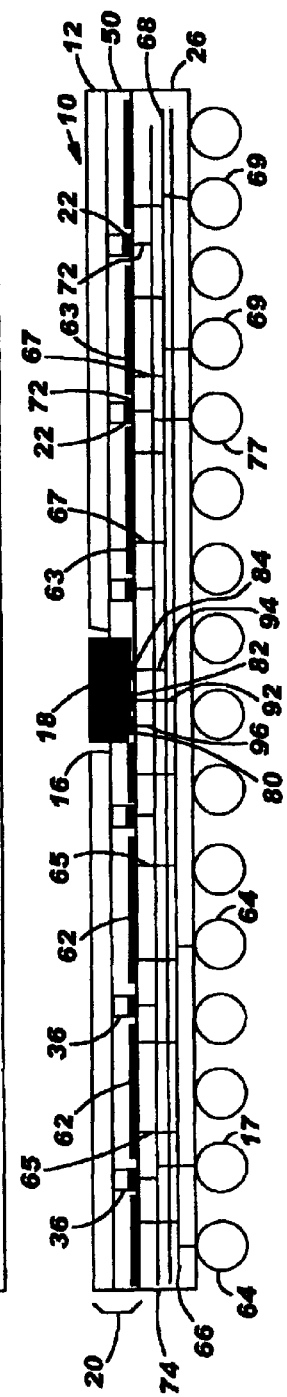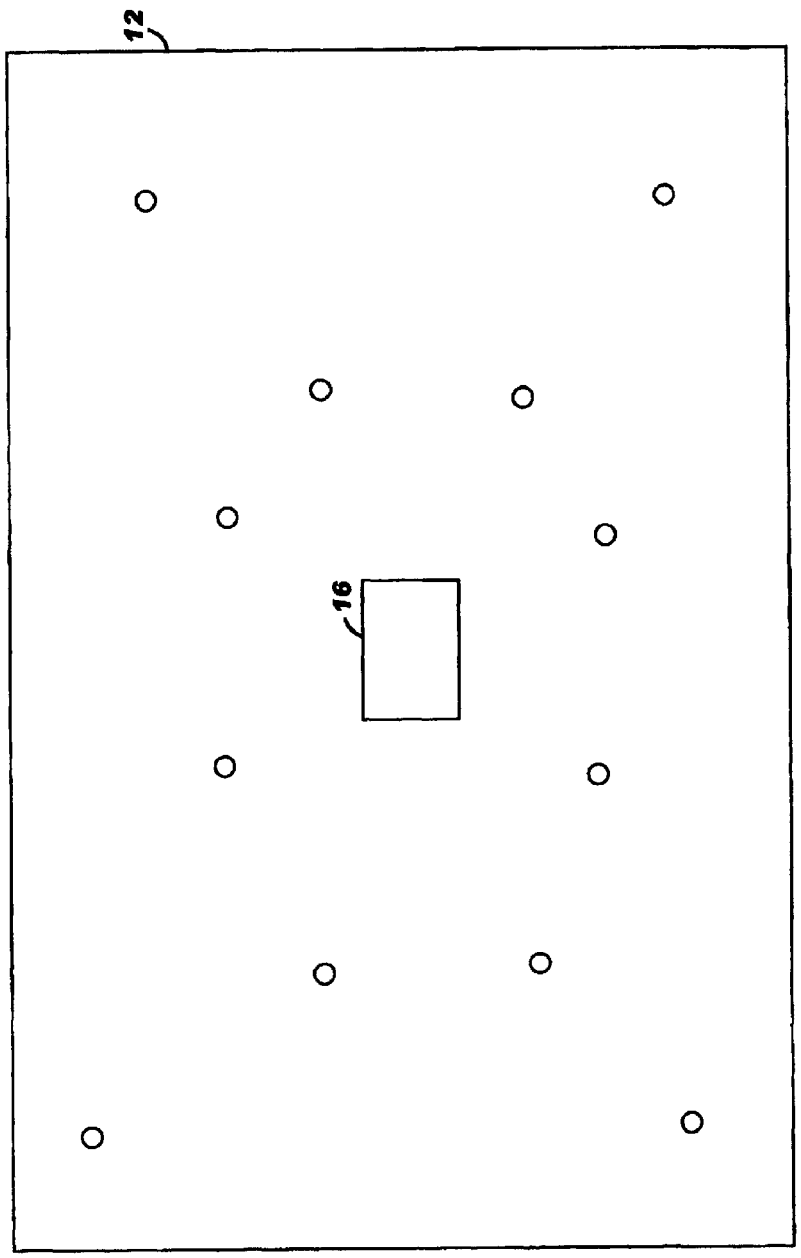

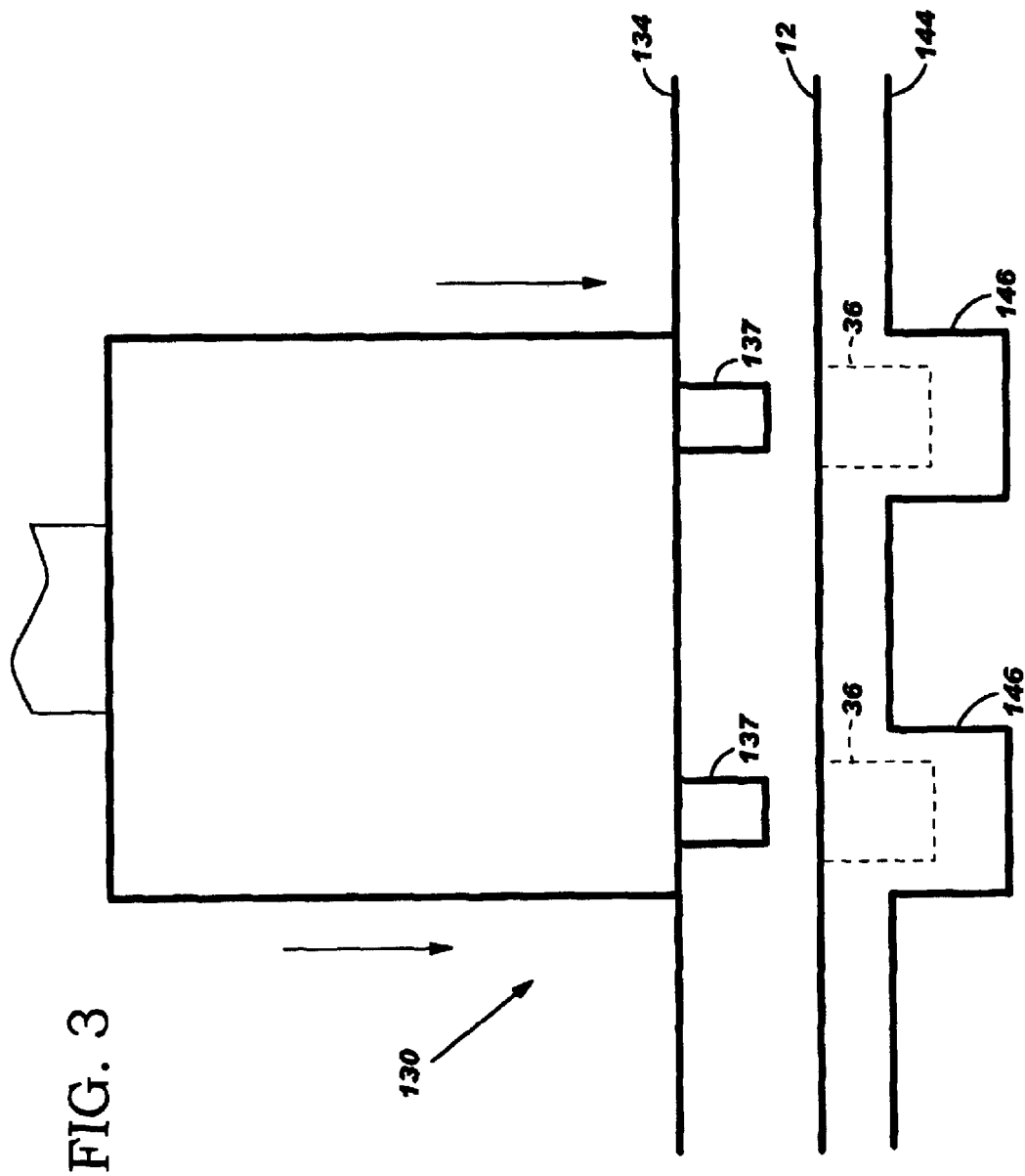

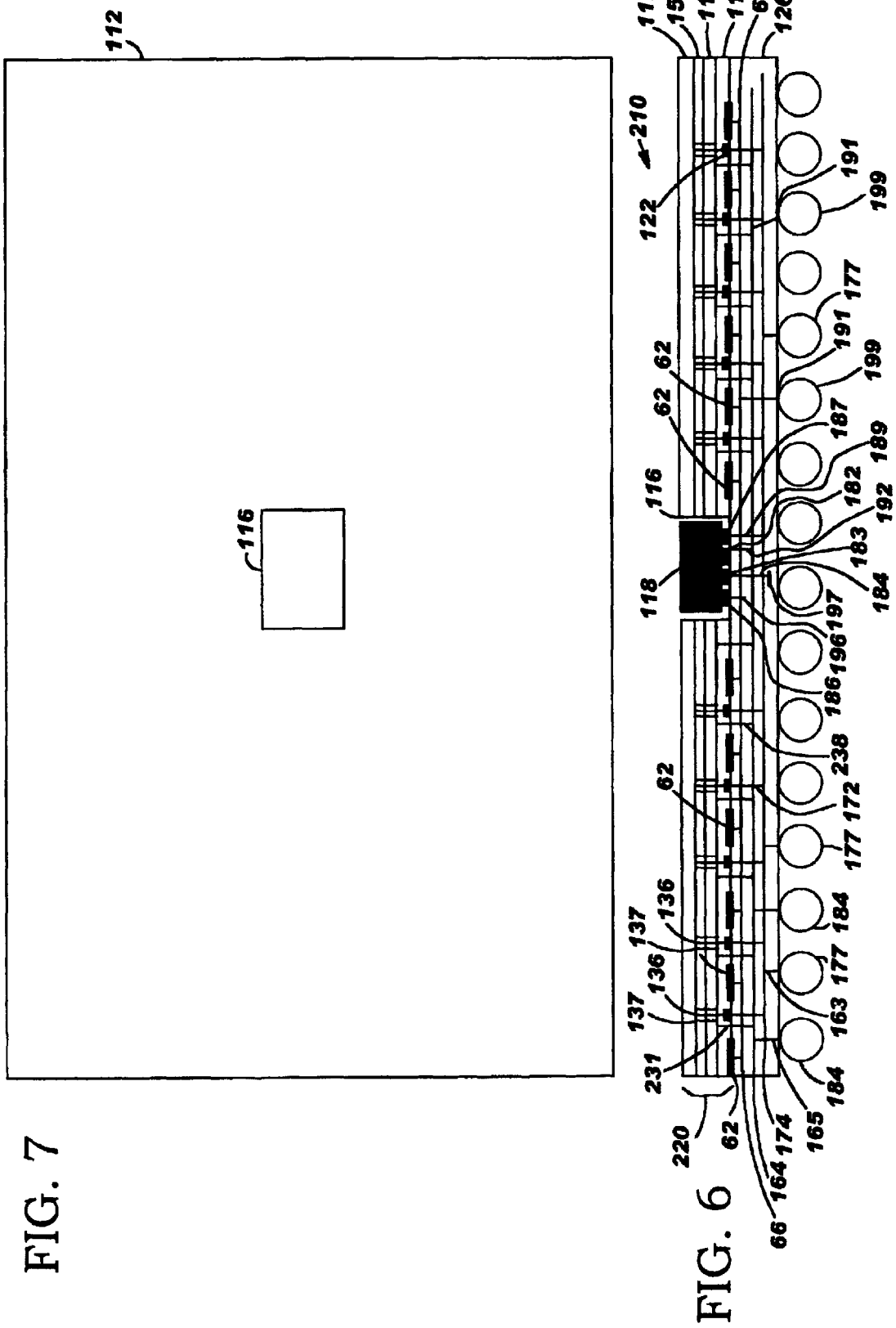

COMPOSITE CAPACITOR AND STIFFENER FOR CHIP CARRIER

BACKGROUND OF THE INVENTION

The invention relates generally to integrated circuit ("chip") packages, and deals more particularly with decoupling capacitors and stiffeners for chip carriers.

Typically a chip is mounted on an organic or inorganic substrate to form a chip "package" or "module". The mounting can utilize a well known wirebond or "flip chip" technique. In the wire bond technique, wires are bonded to pads on the chip and also to pads on the substrate to make an electrical (and mechanical) connection. In the flip-chip arrangement, the chip includes pads on one face and they are mounted by solder balls directly to matching pads on the substrate. This provides both an electrical (and mechanical) connection. One such flip chip bonding technique was developed by International Business Machines Corporation and is called "Controlled Collapse Chip Connection" or "C4" for short. Other flip chip bonding techniques are well known in the industry. Typically, the chip package or module (whether formed by wire bond or flip chip) is subsequently mounted on a printed circuit board.

Circuitry within chips is noisy, i.e. there are high frequency transients incident to switching of transistors in the chip. This is especially true for modern day CMOS technology. The problem is compounded because of high density of the circuitry. Also, some CMOS designs operate from a low power supply voltage, so moderate voltage transients in the power or ground plane can temporarily cause an improper digital value. In some cases, the noise from the chip can also affect circuitry on the printed circuit board.

It is well known to provide some type of decoupling capacitor between power and ground. For example, it was known to provide decoupling capacitors in the chip, or discrete decoupling capacitors on the chip carrier and on the printed circuit board. Discrete capacitors have metal leads leading to the capacitive element, and there are conductive traces on the chip carrier (or printed circuit board) between the source of the noise and the metal leads. One problem with discrete capacitors is the series resistance and series inductance between the source of the noise and the actual capacitor caused by the metal leads and conductive traces. It was also known to provide "buried capacitance" within the printed circuit board. See for example, U.S. Pat. No. 5,079,069 to Howard et al., U.S. Pat. No. 5,010,641 to Sisler, U.S. Pat. No. 6,343,001 to Japp et al., U.S. Pat. No. 5,161,086 to Howard et al, U.S. Pat. No. 6,524,352 to Adae-Amoakoh et al., U.S. Pat. No. 6,496,356 to Japp et al., U.S. Pat. No. 5,972,053 to Hoffarth et al., U.S. Pat. No. 5,796,587 to Lauffer et al., and U.S. Pat. No. 6,343,001 to Papathomas et al. A "buried capacitance" is a layer of metal, a layer of dielectric and a layer of metal formed as part of a multi-layer printed circuit board. One metal layer may be a power plane and the other metal layer a ground plane. Such buried capacitance can be formed as follows. Typically the printed circuit board is formed from "cores" laminated together. A "core" is a layer of copper foil and a dielectric layer laminated together. Before the cores are laminated together to form the printed circuit board, the copper layers are circuitized as needed. Those copper layers intended for signal paths have much of the copper etched away to form the signal conductors. Other copper layers intended for power and ground planes have relatively little copper etched away. To form the buried capacitor, a power plane and a ground plane are situated adjacent to each other, separated only by a single layer of dielectric. U.S. Pat. No. 6,343,001 discloses a parallel capacitive structure with two power planes sharing a common ground plane located between the two power planes and a plated through hole through the common ground plane and adjacent dielectric layers to interconnect the two power planes. U.S. Pat. No. 4,937,649 discloses a capacitor on the surface of an integrated circuit.

Some chip carrier substrates are thin, and require a stiffener. It was known to bond a relatively thick metal layer to the chip carrier substrate to stiffen the chip carrier. It was also known to provide a center cutout in the metal layer to house the chip.

Japanese Published Patent Application JP2000-232260A by Ogawa Koju (NGK Spark Plug Co. LTD) discloses a combined capacitor and stiffener for a chip carier. This capacitor/stiffener comprises an electrode 123/copper plate stiffener 121, an electrode 124 and an intervening dielectric layer 122. Electrode 123 covers one face of the capacitor and also wraps around the sides of the capacitor and the perimeter of the other face of the capacitor. After formation, this capacitor is electrically and mechanically connected to a face of a wiring board main body 110 by conductive resin bodies 143 and 144 and to a wiring layer 102. The capacitor/stiffener has an opening in the middle to accomodate the chip.

An object of the present invention is to provide one or more capacitors for a chip carrier, in a manner which is less complicated and less expensive than the prior art.

Another object of the present invention is to provide a composite capacitor/stiffener for a chip carrier, which is less complicated and less expensive than the prior art.

SUMMARY OF THE INVENTION

The present invention resides in a chip package comprising a substrate with a composite capacitor/stiffener on the substrate. In one embodiment of the present invention, the substrate comprises a plurality of dielectric layers and a plurality of metallic layers interlaced with the dielectric layers. One of the metallic layers is on a surface of the substrate. Another dielectric layer is adhered onto the one metallic layer. A metallic plate is adhered onto the other dielectric layer, opposite the one metallic layer. The metallic plate is electrically connected to power or ground by a conductor passing through the other dielectric layer. The one metallic layer is electrically connected to ground or power, respectively, such that the metallic plate, the other dielectric layer and the one metallic layer form a capacitor. The one metallic layer is joined to a respective one of the plurality of dielectric layers in a same manner as another of the plurality of metallic layers is joined to another, respective one of the plurality of dielectric layers.

The invention also resides in a chip package comprising a substrate and another composite capacitor/stiffener. A first metallic plate is on the substrate. The first metallic plate has a cutout to receive the chip and is connected to power or ground. A dielectric layer is on the first metallic plate. A second metallic plate is on the dielectric layer, opposite the first metallic plate. The second metallic plate has a cutout aligned with the cutout of the first metallic plate to receive the chip. The second metallic plate is connected to power or ground to form a capacitor from the first metallic plate, the dielectric layer and the second metallic plate. The second metallic plate is connected to power or ground by a conductor passing through the dielectric layer and the first metallic plate.

The invention also resides in a chip package comprising a substrate and another composite capacitor/stiffener. The substrate includes a power or ground layer on a surface of the substrate. A first dielectric layer is on the power or ground layer of the substrate. A first metallic plate is on the first dielectric layer. The first metallic plate is connected to a power level or ground such that the power or ground layer of the substrate, the first dielectric layer and the first metallic plate form a first capacitor. A second dielectric layer is on the first metallic plate. A second metallic plate is on the second dielectric layer, opposite the first metallic plate. The second metallic plate is connected to a power level or ground such that the second metallic plate, the second dielectric layer and the first metallic plate form a second capacitor. The second metallic plate is connected to the power level or ground by a conductor passing through the second dielectric layer, the first metallic plate and the first dielectric layer. The second metallic plate, the second dielectric layer, the first metallic plate and the first dielectric layer all have a cutout to receive the chip.

BRIEF DESCRIPTION OF THE FIGURES

FIG. 1 is a cross-sectional view of a chip package including a composite capacitor/stiffener according to the present invention.

FIG. 2 is a top view of a metal plate used to form the composite capacitor/stiffener of FIG. 1.

FIG. 3 is a side view of an extrusion tool used to form the metal plate of FIG. 1.

FIG. 6 is a cross-sectional view of a chip package including a composite capacitor/stiffener according to a third embodiment of the present invention.

FIG. 7 is a top view of the composite capacitor/stiffener of FIG. 6.

DETAILED DESCRIPTION OF THE PREFERRED EMBODIMENTS

Figure 5:
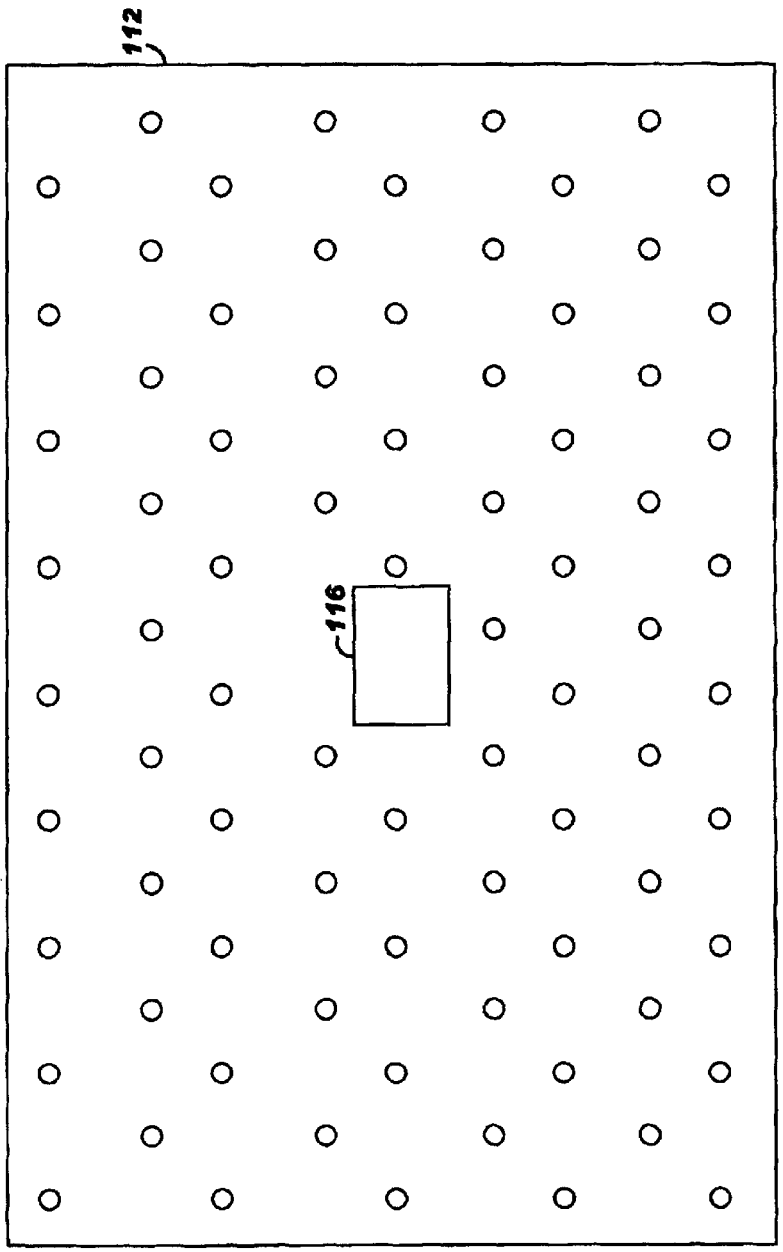
FIG. 5 is a top view of the composite capacitor/stiffener of FIG. 4.

Referring now to the drawings in detail, wherein like reference numbers indicate like elements throughout, FIG. 1 is a cross-sectional view of a chip package generally designated 10 according to the present invention. Chip package 10 includes a substrate 26 and a top metal plate 12 of a composite capacitor/stiffener 20. By way of example, the metal plate 12 can be anodized aluminum ten to twenty five mils thick, copper ten to twenty five mils thick, or stainless steel ten to twenty five mils thick to provide significant stiffness to the chip carrier. However, it should be noted that if capacitance is desired for the chip package without significant additional stiffness, then metal plate 12 can be thinner, such as the thickness of the metal layers within the substrate 26. The metal plate includes a square center cutout 16 for a chip 18. A top view of metal plate is illustrated in FIG. 2. Metal plate 12 makes an electrical connection to a ground plane 74 within substrate 26. This connection is through a multiplicity of conductors 36,36 passing through a dielectric layer 50 between the metal plate 12 and the substrate 26, metal pads 22, 22 on the surface of substrate 26 and vias 72,72 within the substrate 26. The capacitor/stiffener 20 comprises the metal plate 12, the dielectric layer 50 and a top metallic layer 62,62 and 63,63 of substrate 26.

In the preferred embodiment of the present invention, dielectric layer 50 is a sheet of high-K dielectric adhesive such as GE Silicone 3281, or ceramic-polymer composites one to two mils thick. This layer not only serves as the dielectric component of capacitor 20 but also serves to adhere the metal plate 12 to the substrate 26 by application of pressure (for example, 350 psi) and heat (for example, 150 degrees C.).

As further illustrated in FIG. 1, the substrate 26 comprises multiple layers, alternating between dielectric material and copper foil. The copper foil may be circuitized to provide signal lines and also provides power and ground planes. On a top surface 60 of the substrate are one or more power planes 62,62 and 63,63 (connected by different voltage levels) to complete the capacitor 20. In the illustrated embodiment, there are two separate power planes 62 and 63 for two different voltage levels. Two power planes are provided to form two different capacitors because the chip 18 utilizes two different voltage levels, and needs high frequency decoupling for both voltage levels. However, other chips may only have one voltage level or need high frequency decoupling for only one voltage level, and therefore, require only one high frequency capacitor. In this latter case, there is only power plane on the surface of substrate 26; this one power plane would include both the metal layers 62 and 63 electrically connected to the same voltage level. There are different ways to form the one or more power planes. Typically, the power plane(s) are inherent to the substrate which is formed from multiple "cores" laminated together. Each core comprises a layer of dielectric (such as twenty mils of FR4, ten mils of PTFE or twenty mils of Driclad dielectric) and a layer of copper foil (typically 0.4 to 1.0 mil thick) laminated together. Typically, the copper foil on each core is etched to some extent before lamination with the other cores. In the case where the core serves as a ground or power plane, limited regions may be removed to allow pads for other voltage connections or signal connections or to allow vias to pass through. (In the case where the core serves as a signal plane, much of the core is selectively removed to form the signal conductors.) In any of these cases, the power plane(s) 62 and 63 are part of the substrate and were formed prior to attachment of the dielectric layer 50 and metal plate 12 to the substrate. This is an economical way to form the bottom metallic layer(s) of the capacitor/stiffener. Also, the use of the top surface of the substrate 26 to form the power planes allows the formation of two or more separate capacitors, if needed, as described above.

Power is brought to power plane 62 from vias 65, 65 within substrate 26, internal power plane 66 and one or more solder balls 64,64 connected to the power plane 66 and to a printed circuit board (not shown) to which the chip carrier is mounted. The power supply which generates the voltage for power plane 62 can reside on the printed circuit board or reside elsewhere and its power brought into the printed circuit board. Power is brought to power plane 63 from vias 67, 67 within substrate 26, internal power plane 68 and one or more solder balls 69,69 connected to the power plane 68 and to the printed circuit board (not shown) to which the chip carrier is mounted. The power supply which generates the voltage for power plane 63 can reside on the printed circuit board or reside elsewhere and its power brought into the printed circuit board. There are also gaps in the power planes 62 and 63 on the surface of substrate 26. In those gaps are the pads 22,22 connected to the metallic conductors 36,36 of metal plate 12 as described above. Pads 22,22 are connected to ground by vias 72,72, internal ground plane 74 and solder balls 77, 77 connected to the ground plane and the printed circuit board. Thus, two capacitors are formed by metal plate 12, dielectric layer 50 and power planes 62 and 63 on the surface of substrate 26. As explained above, if only one capacitor is required, then both power planes 62 and 63 are connected to the same internal power plane 66 or 68 as needed by appropriate vias.

FIG. 1 also illustrates chip 18 which is mounted on substrate 26 within the cutout in metal plate 12. Chip 18 is a "flip-chip" arrangement, and by way of example, has C4 solder balls on its underside to interconnect the chip to mating pads 82, 84, 86 on substrate 26. Pad 82 is connected to internal power plane 66 by a via 92. Pad 84 is connected to internal power plane 68 by a via 94. Pad 86 is connected to internal ground plane 74 by a via 99. Thus chip 80 is coupled to the two capacitors formed by metal plate 12, dielectric layer 50 and surface power planes 62 and 63. Chip 18 is also connected to multiple signal conductors within substrate 26 by other solder balls, metal pads and vias (not shown). Because of the proximity of the two capacitors to the chip, the series resistance and series inductance between the chip and the capacitors is minimized.

It is also possible and desirable in many application to provide some additional discrete capacitors on the associated printed circuit board. While these will not provide as high frequency decoupling as composite capacitor 20, they can provide a higher amount of capacitance. So, the capacitors formed by metal plate 12, dielectric layer 50 and power planes 62 and 63 would provide most of the high frequency decoupling and the discrete capacitors would provide most of the low and moderate frequency decoupling. The discrete capacitors would be connected between the power plane(s) and the ground plane on the printed circuit board (not shown).

There are different ways to form the conductors 36, 36. In one embodiment of the present invention, the conductors 36,36 are downwardly facing hollow "dimples" of metal plate 12 formed by an extrusion tool 130 shown in FIG. 3. Extrusion tool 130 comprises an extrusion plate 134 with protruding dimples 137, 137. Tool 130 also comprises a hydraulic cylinder to exert a downward force on plate 134. Tool 130 also comprises a support plate 144 with holes 146, 146 slightly larger than and aligned with dimples 137, 137. Metal plate 12 is supported on support plate 144, and impression plate 134 with its protruding dimples is pressed against metal plate 12 and imprints the dimples 36,36 in the metal plate 12. If desired, extrusion plate 134 can also include a square punch to form cutout 16 at the same time the dimples are formed. As illustrated in FIG. 1, there are a multiplicity of dimples in metal plate 12 distributed about the surface of metal plate to minimize the series resistance and series inductance between the capacitor and the source of the noise. Holes are punched in the dielectric layer 50 prior to lamination with metal plate 12 to receive the dimples and allow them to pass through to the metal pads 22,22 below. After application of the dielectric adhesive layer, metal plate 12 is subject to heat (150 degrees C.) and downward force (350 psi) to laminate the metal plate 12 and adhesive layer 50 to the substrate 26.

The conductors 36, 36 can also be formed as follows. The metal plate 12 and dielectric layer 50 are laminated to the substrate 26 by heat and pressure (without any holes being pre-punched in the dielectric layer). Then, "blind via" like holes can be mechanically drilled through metal pate 12 and dielectric layer 50. Then, conductive epoxy, filler or solder is filled into the blind vias to interconnect the metal plate 12 to metal pads 22,22 on the top surface of the substrate.

Figure 4:
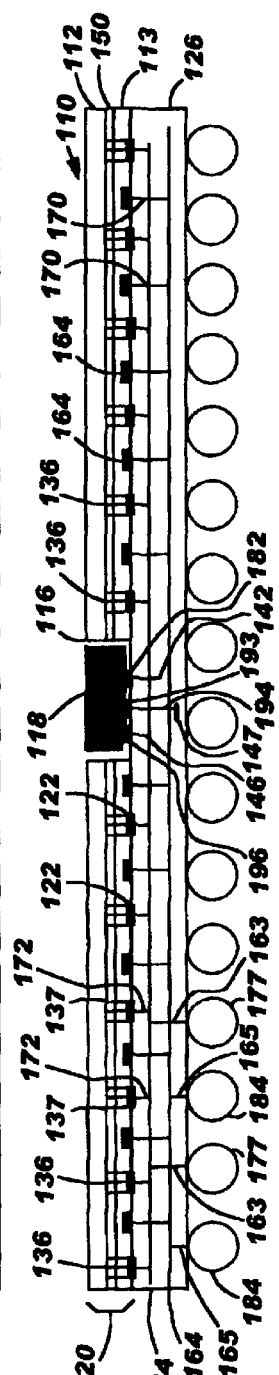
FIG. 4 is a cross-sectional view of a chip package including a composite capacitor/stiffener according to a second embodiment of the present invention.

FIG. 4 is a cross-sectional view of another chip package generally designated 110 according to the present invention. Chip package 110 includes a substrate 126, a top metal plate 112 of a composite capacitor/stiffener 120, a bottom metal plate 113 of the composite capacitor/stiffener and an intervening dielectric layer 150. FIG. 5 illustrates a top view of metal plate 112. By way of example, each of the metal plates can be anodized aluminum ten to twenty five mils thick, copper ten to twenty five mils thick, or stainless steel ten to twenty five mils thick to provide significant stiffness to the chip carrier. However, it should be noted that if capacitance is desired for the chip package without significant additional stiffness, then metal plates 112 and 113 can be thinner, such as the thickness of the metal layers within the substrate 126. Each of the metal plates 112 and 113 includes a square center cutout 116 for a chip 118. Metal plate 112 makes an electrical connection to a ground plane 174 within substrate 126. This connection is through a multiplicity of conductors 136,136 (passing through dielectric layer 150 and clearance holes 137,137 in metal plate 113,) metal pads 122,122 on the surface of substrate 126 and vias 172,172. In the preferred embodiment of the present invention, dielectric layer 150 is a sheet of high-K dielectric adhesive such as GE Silicone 3282 or ceramic-polymer composites one to two mils thick. This layer not only serves as the dielectric component of capacitor 120 but also serves to adhere the metal plate 112 to the metal plate 113 by application of pressure (for example, 350 psi) and heat (for example, 150 degrees C.). Metal plate 113 makes an electrical connection to a power plane 164 by being soldered to metal pads 169,169. Metal pads 169,169 are connected to blind vias 170,170 which lead to the power plane 164. Typically, capacitor/stiffener 120 is formed separately from the substrate and then soldered to the substrate at the pads 169,169 to make a mechanical connection and the foregoing electrical connection. If desired, a layer of adhesive can be used between metal plate 113 and the substrate to provide additional mechanical connection. Also, if desired, the layers of capacitor 120 can be laminated to each other and to the substrate at the same time the layers of the substrate are laminated to each other.

As further illustrated in FIG. 4, the substrate 126 comprises multiple layers, alternating between dielectric material and copper foil. The copper foil is circuitized to provide metal pads 169, 169, signal lines, power plane 164 and ground plane 174. The top surface 160 of the substrate is the dielectric material with the metal pads 169, 169. The substrate may be formed from multiple "cores" laminated together. Each core comprises a layer of dielectric (such as twenty mils of FR4, ten mils of PTFE or twenty mils of Driclad dielectric) and a layer of copper foil (typically 0.4 to 1.0 mil thick) laminated together. Typically, the copper foil on each core is etched to some extent before lamination with the other cores. In the case where an inner core serves as a ground or power plane, limited regions may be removed to allow pads for other voltage connections or signal connections or to allow vias to pass through. (In the case where an inner core serves as a signal plane, much of the core is selectively removed to form the signal conductors.)

Power is brought to power plane 164 from vias 165, 165 within substrate 126 and one or more solder balls 184,184 connected to a power plane within the printed circuit board (not shown) to which the chip carrier is mounted. The power supply which generates the voltage for power plane 164 can reside on the printed circuit board or reside elsewhere and its power brought to the printed circuit board. Internal ground plane 174 is grounded by vias 163,163 and solder balls 177, 177 which are connected to a ground plane within the printed circuit board.

FIG. 4 also illustrates chip 118 which is mounted on substrate 126 within the cutout in metal plate 112. Chip 118 is a "flip-chip" arrangement, and by way of example, has C4 solder balls on its underside to interconnect the chip to mating pads 182, 183, 186 on substrate 126. Pad 182 is connected to internal power plane 164 by a via 192. Pad 183 is connected to internal signal lines 197 (shown partially) by a via 194. Pad 186 is connected to internal ground plane 174 by a via 199. Thus chip 118 is coupled to the capacitor 120 formed by metal plate 112, dielectric layer 150 and metal plate 113. Chip 118 is also connected to multiple signal conductors within substrate 126. Because of the proximity of the capacitor to the chip, the series resistance and series inductance between the chip and the capacitor is minimized.

It is also possible and desirable in many applications to provide some additional discrete capacitors on the associated printed circuit board. While these will not provide as high frequency decoupling as composite capacitor 120, they can provide a higher amount of capacitance. So, the capacitors formed by metal plate 112, dielectric layer 150 and metal plate 113 would provide most of the high frequency decoupling and the discrete capacitors would provide most of the low and moderate frequency decoupling. The discrete capacitors would be connected between the power plane and the ground plane on the printed circuit board (not shown).

There are different ways to form the conductors 136, 136. In one embodiment of the present invention, the conductors 136,136 are downwardly facing hollow "dimples" of metal plate 112 formed by the extrusion tool 130 shown in FIG. 3. As explained above, extrusion tool 130 comprises an extrusion plate with appropriately located protruding dimples. Tool 130 also comprises a hydraulic cylinder to exert a downward force on the extrusion plate. Tool 130 also comprises a support plate with holes slightly larger than and aligned with the dimples. Metal plate 112 is supported on the support plate, and the extrusion plate with its protruding dimples is pressed against metal plate 112 and imprints the dimples in the metal plate 112. If desired, the extrusion plate can also include a square punch to form cutout 116 at the same time the dimples are formed. As illustrated in FIG. 6, there are a multiplicity of dimples in metal plate 112 distributed about the surface of metal plate to minimize the series resistance and series inductance between the capacitor and the source of the noise. Holes are punched in the dielectric layer 150 and metal plate 113 prior to lamination with metal plate 112 to receive the dimples and allow them to pass through to the metal pads 122,122 below without contacting metal plate 113.

FIG. 6 is a cross-sectional view of another chip package generally designated 210 according to the present invention. Chip package 210 differs from chip package 110 in that chip package 210 provides two, stacked capacitors whereas chip package 110 provides only one. Chip package 210 includes a substrate 126, a top metal plate 112, a dielectric layer 150, a bottom metal plate 113, and another dielectric layer 114. Top metal plate 112, dielectric layer 150 and bottom metal plate 113 form one capacitor of the composite capacitor/stiffener 220. Bottom metal plate 113, dielectric layer 114 and a metal layer 62,62 on the surface of substrate 126 form the other capacitor of the composite capacitor/stiffener 220. Metal layer 62,62 is the copper foil part of one core from which substrate 126 is made. As explained below, top metal plate 112 is connected to ground, bottom metal plate 113 is connected to one power plane, and metal layer 62,62 is connected to another power plane. By way of example, each of the metal plates 112 and 113 can be anodized aluminum ten to twenty five mils thick, copper ten to twenty five mils thick, or stainless steel ten to twenty five mils thick to provide significant stiffness to the chip carrier. However, it should be noted that if capacitance is desired for the chip package without significant additional stiffness, then metal plates 112 and 113 can be thinner, such as the thickness of the metal layers within the substrate 126. Each of the metal plates 112 and 113 includes a square center cutout 116 for chip 118. Metal plate 112 makes an electrical connection to a ground plane 174 within substrate 126. This connection is through a multiplicity of conductors 136,136 (passing through dielectric layers 150 and 114 and clearance holes 137,137 in metal plate 113), metal pads 122,122 on the surface of substrate 126 and vias 172,172. In the preferred embodiment of the present invention, dielectric layers 150 and 114 are each a sheet of high-K dielectric adhesive such as GE Silicone 3282 or ceramic-polymer composites one to two mils thick. Layer 150 not only serves as a dielectric component of capacitor 220 but also serves to adhere the metal plate 112 to the metal plate 113 by application of pressure (for example, 350 psi) and heat (for example, 150 degrees C.). Layer 114 not only serves as a dielectric component of capacitor 220 but also serves to adhere the metal plate 113 to the substrate 126 by application of pressure (for example, 350 psi) and heat (for example, 150 degrees C.). Metal plate 113 makes an electrical connection to a power plane 164 by conductors 231. Conductors 231 may comprise blind vias all the way from metal plate 113 to power plane 164 or a downwardly facing dimple from plate 113 leading to a blind via which leads to the power plane 164. Layers 112,150 and 113 may be formed as a unit separately from the substrate and then adhered to the substrate by dielectric layer 114. However, the layers 112, 150, 113 and 114 of capacitor 220 can be laminated to each other and to the substrate at the same time the layers of the substrate are laminated to each other.

As further illustrated in FIG. 6, the substrate 126 comprises multiple layers, alternating between dielectric material and copper foil. The copper foil is circuitized to provide metal pads 122, 122, signal lines 197, power plane 66, power plane 164 and ground plane 174. The top surface of the substrate comprises the metal foil layer 62,62 with the metal foil pads 122, 122. The substrate may be formed from multiple "cores" laminated together. Each core comprises a layer of dielectric (such as twenty mils of FR4, ten mils of PTFE or twenty mils of Driclad dielectric) and a layer of copper foil (typically 0.4 to 1.0 mil thick) laminated together. Typically, the copper foil on each core is etched to some extent before lamination with the other cores. In the case where an inner or outer core serves as a ground or power plane, limited regions may be removed to allow pads for other voltage connections or signal connections or to allow vias to pass through. In the case where an inner core serves as a signal plane, much of the core is selectively removed to form the signal conductors.

Power is brought to power plane 164 from vias 165,165 within substrate 126 and one or more solder balls 184,184 connected to a power plane within the printed circuit board (not shown) to which the chip carrier is mounted. The power supply which generates the voltage for power plane 164 can reside on the printed circuit board or reside elsewhere and its power brought into the printed circuit board. Power is brought to power plane 66 from vias 191,191 within substrate 126 and one or more solder balls 199,199 connected to a power plane within the printed circuit board (not shown) to which the chip carrier is mounted. The power supply which generates the voltage for power plane 66 can reside on the printed circuit board or reside elsewhere and its power brought into the printed circuit board. Internal ground plane 174 is grounded by vias 163,163 and solder balls 177, 177 which are connected to a ground plane within the printed circuit board.

FIG. 6 also illustrates chip 118 which is mounted on substrate 126 within the cutout in metal plates 112 and 113. Chip 118 is a "flip-chip" arrangement, and by way of example, has C4 solder balls on its underside to interconnect the chip to mating pads 182, 183, 186 on substrate 126. Pad 182 is connected to internal power plane 164 by a via 192. Pad 183 is connected to internal signal lines 197 (shown partially) by a via 194. Pad 186 is connected to internal power plane 66 by a via 196. Pad 187 is connected to ground plane 174 by a via 189. Thus chip 118 is coupled to the composite capacitor 220 formed by metal plate 112, dielectric layer 150, metal plate 113, dielectric layer 114 and power plane 62,62. Chip 118 is also connected to multiple signal conductors within substrate 126. Because of the proximity of the composite capacitor to the chip, the series resistance and series inductance between the chip and the composite capacitor is minimized.

It is also possible and desirable in many applications to provide some additional discrete capacitors on the associated printed circuit board. While these will not provide as high frequency decoupling as composite capacitor 220, they can provide a higher amount of capacitance. So, the capacitors formed by metal plate 112, dielectric layer 150 and metal plate 113, and by metal plate 113, dielectric layer 114 and metal layer 62,62 would provide most of the high frequency decoupling and the discrete capacitors would provide most of the low and moderate frequency decoupling. The discrete capacitors would be connected between the power plane and the ground plane on the printed circuit board (not shown).

There are different ways to form the conductors 136, 136. In one embodiment of the present invention, the conductors 136,136 are downwardly facing hollow "dimples" of metal plate 112 formed by the extrusion tool 130 shown in FIG. 4. As explained above, extrusion tool 130 comprises an extrusion plate with appropriately located protruding dimples. Tool 130 also comprises a hydraulic cylinder to exert a downward force on the extrusion plate. Tool 130 also comprises a support plate with holes slightly larger than and aligned with the dimples. Metal plate 112 is supported on the support plate, and the extrusion plate with its protruding dimples is pressed against metal plate 112 and imprints the dimples in the metal plate 112. If desired, the extrusion plate can also include a square punch to form cutout 116 at the same time the dimples are formed. As illustrated in FIG. 7, there are a multiplicity of conductors 137, 137 to minimize the series resistance and series inductance between the capacitor and the source of the noise. Likewise, downwardly facing dimples can be formed in metal plate 113. Holes are punched in the dielectric layer 150, metal plate 113 and dielectric layer 114 prior to lamination with metal plate 112 to receive the dimples of metal plate 112 and allow them to pass through to the metal pads 122,122 below without contacting metal plate 113. Holes are punched in the dielectric layer 114 prior to lamination with substrate 126 to receive the dimples of metal plate 113 and allow them to pass through to the substrate.

Based on the foregoing, composite capacitor/stiffeners and composite capacitors (without significant stiffness) for a chip carrier substrate have been disclosed. However, numerous modifications and substitutions can be made without deviating from the scope of the present invention. Therefore, the present invention has been disclosed by way of illustration and not limitation, and reference should be made to the following claims to determine the scope of the present invention.

What is claimed is:

1. A chip package comprising:
a substrate comprising a plurality of dielectric layers and a plurality of metallic layers interlaced with said dielectric layers, one of said metallic layers being on a surface of said substrate, each of said plurality of dielectric layers composed of a same material and having substantially a same thickness as each other, each of said plurality of metallic layers composed of a same material and having substantially a same thickness as each other, each of said plurality of metallic layers being joined to adjacent ones of said dielectric layers in substantially a same manner as each other of said plurality of metallic layers is joined to adjacent ones of said dielectric layers;
another dielectric layer adhered onto said one metallic layer; and
a metallic plate adhered onto said other dielectric layer, opposite said one metallic layer, said metallic plate being electrically connected to power or ground by a conductor passing through said other dielectric layer, said one metallic layer being electrically connected to ground or power, respectively, such that said metallic plate, said other dielectric layer and said one metallic layer form a capacitor, said metallic plate being substantially thicker and stiffer than each of said plurality of metallic layers to significantly add stiffness to said substrate, said metallic plate having a cutout to receive a chip.

2. A chip package as set forth in claim 1 wherein said one metallic layer and another of said plurality of metallic layers are substantially the same except for differences in regions in said one metallic layer and said other metallic layer which have been etched away.

3. A chip package as set forth in claim 1 wherein said plurality of metallic layers and said plurality of dielectric layers are joined together as a unit before said other dielectric layer and said metallic plate are joined onto said one metallic layer.

4. A chip package as set forth in claim 1 further comprising metallic conductors passing from said metallic plate through said other dielectric layer and terminating at respective metallic pads on said one metallic layer, said metallic pads being connected to ground.

5. A chip package as set forth in claim 4 wherein said one metallic layer being connected to a non zero voltage level to form a power plane, said power plane being isolated from said metallic pads.

6. A chip package as set forth in claim 4 wherein said metallic conductors are dimples extruded from said metallic plate and passing through holes in said dielectric layer.

7. A chip package as set forth in claim 1 wherein said one metallic layer is divided into a plurality of power planes, each at a different voltage level, whereby said plurality of power planes and respective portions of said other dielectric layer and said metallic plate form a respective plurality of capacitors.

8. A chip package as set forth in claim 1 wherein said metallic plate comprises aluminum ten to twenty five mils thick, copper ten to twenty five mils thick or stainless steel ten to twenty five mils thick, and each of said metallic layers comprises copper foil 0.4 to 1.0 mils thick.

9. A chip package as set forth in claim 1 wherein said one metallic layer includes a cutout, aligned with the cutout in said metallic plate, to receive said chip.

10. A chip package comprising:

a substrate upon which to mount a chip;

a first metallic plate on said substrate, said first metallic plate having a cutout to receive said chip, said first metallic plate being connected to power or ground;

a dielectric layer on said first metallic plate; and a second metallic plate on said dielectric layer, opposite said first metallic plate, said second metallic plate having a cutout aligned with the cutout of said first metallic plate to receive said chip, said second metallic plate being connected to power or ground to form a capacitor from said first metallic plate, said dielectric layer and said second metallic plate, and wherein said second metallic plate is connected to power or ground by a conductor passing through said dielectric layer and said first metallic plate; and wherein said first metallic plate is ten to twenty-five mils thick and said second metallic plate is ten to twenty-five mils thick.

11. A chip package as set forth in claim 10 wherein said second metallic plate is connected to ground or power by dimples extruded from said second metallic plate, said dimples passing through holes in said dielectric layer and said first metallic plate.

12. A chip package as set forth in claim 10 wherein said second metallic plate is connected to ground or power by conductors passing from said second metallic plate through holes in said dielectric layer and said first metallic plate.

13. A chip package as set forth in claim 12 wherein said second metallic plate is connected to ground or power by metal pads on said substrate, said metal pads being connected to said conductors.

14. A chip package as set forth in claim 10 wherein said first metallic plate comprises aluminum, copper or stainless steel, and said second metallic plate comprises aluminum, copper or stainless steel.

15. A chip package as set forth in claim 10 wherein said first and second metallic plates are flexible before connection to said substrate.

16. A chip package as set forth in claim 10 wherein said substrate comprises alternating layers of dielectric material and etched metal foil, and wherein said first and second metallic plates are substantially thicker than said etched metal foil to significantly stiffen said substrate.

17. A chip package comprising:

a substrate upon which to mount a chip, said substrate including a power or ground layer on a surface of said substrate;

a first dielectric layer on said power or ground layer of said substrate;

a first metallic plate on said first dielectric layer, said first metallic plate being connected to a power level or ground such that said power or ground layer of said substrate, said first dielectric layer and said first metallic plate form a first capacitor;

a second dielectric layer on said first metallic plate; and a second metallic plate on said second dielectric layer, opposite said first metallic plate, said second metallic plate being connected to a power level or ground such that said second metallic plate, said second dielectric layer and said first metallic plate form a second capacitor, said second metallic plate, said second dielectric layer, said first metallic plate and said first dielectric layer all having a cutout to receive said chip, and wherein said second metallic plate is connected to said power level or ground by a conductor passing through said second dielectric layer, said first metallic plate and said first dielectric layer, and said first metallic plate is ten to twenty-five mils thick and said second metallic plate is ten to twenty-five mils thick.

18. A chip package as set forth in claim 17 wherein said substrate is made of alternating layers of dielectric material and etched metal foil, and said first and second dielectric layers are different in composition than the dielectric material within said substrate, and said first and second metallic plates are substantially thicker than said etched metal foil.

19. A chip package as set forth in claim 17 wherein said power or ground layer on said surface of said substrate is substantially devoid of metal foil underneath said chip, except for metallic pads to interconnect to said chip.

20. A chip package as set forth in claim 17 wherein said first metallic plate is connected to a power level or ground by a conductor passing from said first metallic plate through holes in said first electric layer.

21. A chip package as set forth in claim 17 wherein said first metallic plate comprises aluminum, copper or stainless steel; and said second metallic plate comprises aluminum, copper or stainless steel.

22. A chip package as set forth in claim 1 wherein each of said dielectric layers comprises an organic material.

23. A chip package as set forth in claim 1 wherein each of said dielectric layers comprises FR4, PTFE or Driclad material.

* * * * *